United States Patent
Lai et al.

(10) Patent No.: US 12,476,145 B2
(45) Date of Patent: Nov. 18, 2025

(54) SELF-ALIGNED CUT-METAL LAYER METHOD

(71) Applicant: Taiwan Semiconductor Manufacturing Co., Ltd., Hsinchu (TW)

(72) Inventors: Yu-Tse Lai, Hsinchu (TW); Shih-Ming Chang, Hsinchu (TW); Ya-Hui Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 856 days.

(21) Appl. No.: 17/559,813

(22) Filed: Dec. 22, 2021

(65) Prior Publication Data

US 2022/0301932 A1    Sep. 22, 2022

Related U.S. Application Data

(60) Provisional application No. 63/163,571, filed on Mar. 19, 2021.

(51) Int. Cl.
 *H01L 21/768*  (2006.01)
 *H01L 21/3213*  (2006.01)
 (Continued)

(52) U.S. Cl.
 CPC .... *H01L 21/76897* (2013.01); *H01L 23/5226* (2013.01); *H10D 30/6729* (2025.01);
 (Continued)

(58) Field of Classification Search
 CPC ......... H01L 21/76897; H01L 21/76885; H01L 21/76816; H01L 21/32139; H01L 21/76892; H01L 21/823475; H01L 21/823871; H01L 21/76895; H01L 21/76804; H01L 21/76805; H01L 21/76877; H01L 23/5226; H01L 23/5283; H01L 23/5286; H01L 23/528; H01L 23/481; H01L 23/535; H01L 23/5384; H01L 23/5386; H10D 30/501–509; H10D 30/6729; H10D 84/0149; H10D 84/0158; H10D 84/0193; H10D 84/834; H10D 84/853; H10D 86/011; H10D 86/215; H10D 30/0241; H10D 30/0243; H10D 30/6211; H10D 30/6212; H10D 30/6213; H10D 30/6215; H10D 30/6217; H10D 30/6218; H10D 30/6757; H10D 30/6735;
 (Continued)

(56) References Cited

U.S. PATENT DOCUMENTS 9,236,267 B2    1/2016    De et al.
9,502,265 B1    11/2016   Jiang et al.
(Continued)

*Primary Examiner* — Younes Boulghassoul
(74) *Attorney, Agent, or Firm* — Seed IP Law Group

(57) ABSTRACT

Methods of forming self-aligned vias and devices having self-aligned vias are provided. In some embodiments, a method includes forming a first via on a conductive layer. A mask is formed over the conductive layer, and the mask has an opening overlying a portion of the conductive layer and at least partially overlying the first via. A first line end of the conductive layer is formed by selectively removing the portion of the conductive layer, with the first via being aligned with the first line end of the conductive layer.

20 Claims, 17 Drawing Sheets

(51) Int. Cl.
*H01L 23/522* (2006.01)
*H10D 30/67* (2025.01)
*H01L 23/532* (2006.01)
*H10D 64/62* (2025.01)

(52) U.S. Cl.
CPC .. *H01L 21/32135* (2013.01); *H01L 21/32139* (2013.01); *H01L 23/53209* (2013.01); *H01L 23/53257* (2013.01); *H10D 30/6735* (2025.01); *H10D 64/62* (2025.01)

(58) Field of Classification Search
CPC .. H10D 30/502; H10D 30/503; H10D 30/504; H10D 30/506; H10D 30/507; H10D 30/508; H10D 30/014; H10D 30/0191; H10D 30/0193; H10D 30/0194; H10D 30/0195; H10D 30/0196; H10D 30/0197; H10D 62/121; H10D 84/851; H10D 84/852; H10D 84/832; H10D 84/833; H10D 64/251–259; H10D 84/0186; H10D 30/024–0245; H10D 30/62–6219; H10D 30/43–435; H10D 30/019–0198; H10D 62/119–123; H10B 12/36; H10B 12/056
See application file for complete search history.

(56) References Cited

U.S. PATENT DOCUMENTS

| | | | |
|---|---|---|---|
| 9,520,466 | B2 | 12/2016 | Holland et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,786,774 | B2 | 10/2017 | Colinge et al. |
| 9,853,101 | B2 | 12/2017 | Peng et al. |
| 9,881,993 | B2 | 1/2018 | Ching et al. |
| 10,374,040 | B1* | 8/2019 | Chanemougame ......................... H01L 21/823807 |
| 2020/0075595 | A1* | 3/2020 | Shin ................ H01L 21/76897 |
| 2020/0243377 | A1* | 7/2020 | Liu .................. H01L 21/76877 |
| 2021/0082757 | A1* | 3/2021 | Lee .................. H01L 21/28114 |
| 2021/0257474 | A1* | 8/2021 | Lee ........................ B82Y 10/00 |
| 2021/0375758 | A1* | 12/2021 | Huang .............. H01L 21/76897 |

* cited by examiner

X1-X1'

X2-X2'

X3-X3'

X1-X1'

X2-X2'

X3-X3'

X1-X1'

X2-X2'

X3-X3'

SELF-ALIGNED CUT-METAL LAYER METHOD

BACKGROUND

Advances in the manufacture of semiconductor integrated circuits (ICs) have led to increases in functional density (i.e., the number of interconnected devices per chip area) as well as decreases in geometry size (i.e., the smallest component (or line) that can be created using a fabrication process). Increasing functional density while decreasing geometry size generally provides benefits by increasing production efficiency and lowering associated costs. However, such advances in terms of size and density of devices or components has also been accompanied by increased complexity in design and manufacturing of devices incorporating these ICs.

For example, reducing sizes and spacing between ICs features formed on a semiconductor substrate generally includes using a plurality of different photolithographic masks, and cut processes are performed to yield patterned features utilized in the IC.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
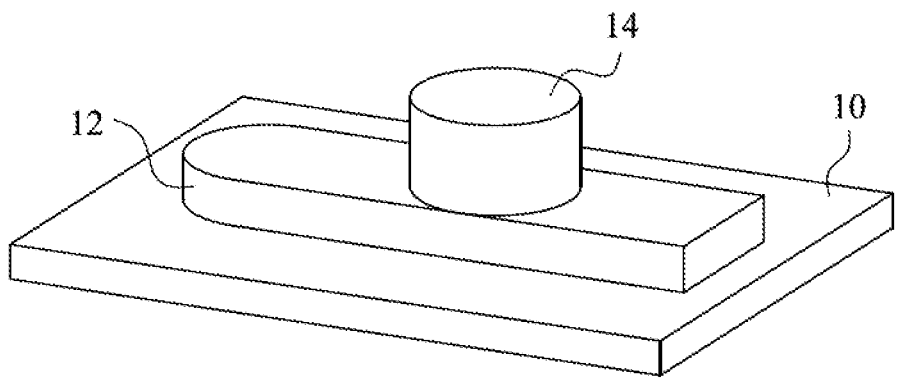
FIGS. 1 through 3 are cross-sectional views illustrating a method of fabricating a device, in accordance with some embodiments of the present disclosure.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to deposition techniques for depositing dielectric layers, metals, or any other materials includes such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described.

Reference throughout the specification to etching techniques for selective removal of semiconductor materials, dielectric materials, metals, or any other materials includes such processes as dry etching, wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain etching techniques should not be limited to those described.

As the sizes or dimensions of features formed in integrated circuits decrease, a spacing, distance, or gap between ends of adjacent features may be constrained by limits of the processing steps utilized to form the features. For example, photolithographic and cutting processes used to manufacture patterned features of an integrated circuit may have lower limits in terms of spacing between features that can practically be achieved. These lower limits may be defined, for example, by dimensions of a photomask that can be physically produced based on the layout for the integrated circuit.

As described herein, the present disclosure provides methods and devices in which line ends of a conductive layer, such as a conductive line, are self-aligned with respect to conductive vias, thereby facilitating a reduction in the distance or gap that may be achieved between patterned features of an integrated circuit. In some embodiments, a via may be formed prior to a cut-metal process in which a portion of the conductive line is selectively removed, thereby forming the line end of a conductive line that is aligned with and underlying the via. The cut process may be performed with a single cut-metal pattern or mask. The reduced mask usage, as compared to conventional techniques, reduces production costs and time. Moreover, the methods and devices provided herein can relieve the via to metal line end enclosure budget and the via to cut-metal spacing budget.

Figure 2:
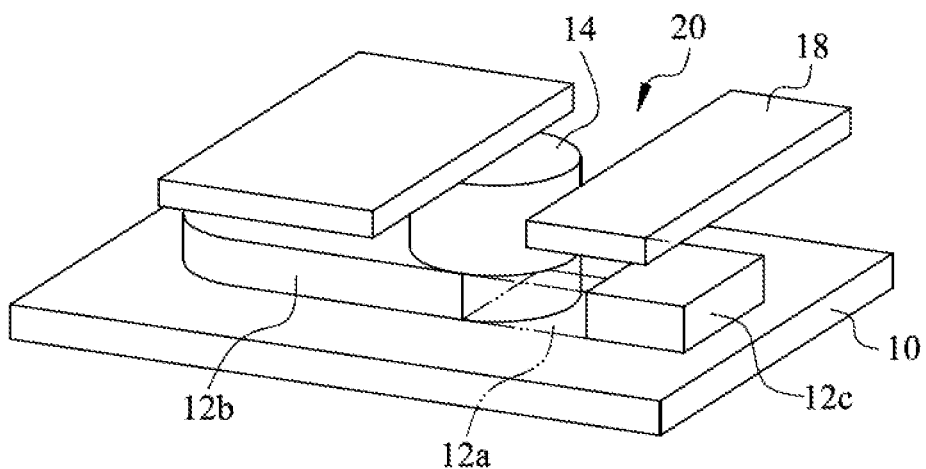
Figure 3:
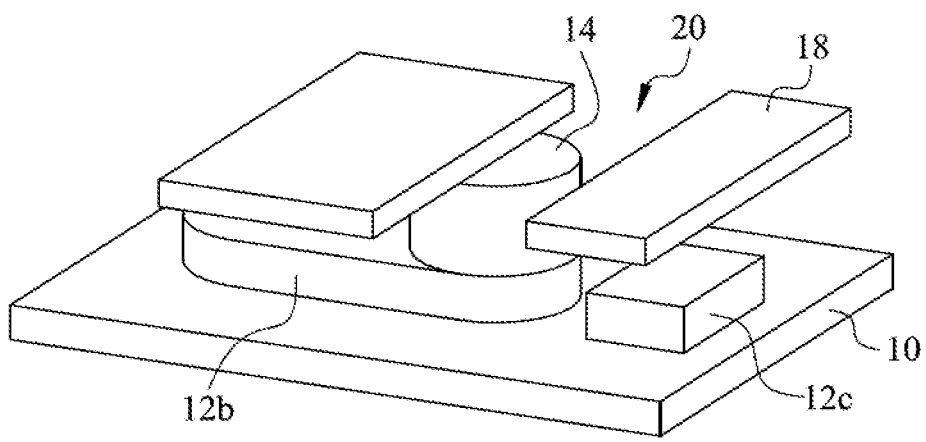

FIGS. 1 through 3 are cross-sectional views illustrating a method of fabricating a device, which may be a semiconductor device, in accordance with one or more embodiments of the present disclosure. Additional steps can be provided before, during, and after the method, and some of the steps described can be replaced or eliminated for other embodiments of the method.

As shown in FIG. 1, a conductive layer 12 is formed on a substrate 10, and a via 14 is formed on the conductive layer 12. The substrate 10 may be any suitable substrate, such as any suitable semiconductor substrate. In various embodiments, the substrate 10 may be formed of a crystalline semiconductor material, for example, monocrystalline silicon, polycrystalline silicon, or some other type of crystalline semiconductor material. In some embodiments, the substrate 10 is a silicon substrate; however, embodiments provided herein are not limited thereto. For example, in various embodiments, the substrate 10 may include gallium arsenide (GaAs), gallium nitride (GaN), silicon carbide (SiC), or any other semiconductor material. The substrate 10 may include various doping configurations depending on design specifications. In some embodiments, the substrate 10 is a p-type substrate having a concentration of p-type dopants. In other embodiments, the substrate 10 is a n-type substrate having a concentration of n-type dopants.

In various embodiments, the substrate 10 may have a substantially uniform composition or may include various layers. The layers may have similar or different compositions, and in some embodiments, some substrate layers have non-uniform compositions to induce device strain and thereby tune device performance. Examples of layered substrates include silicon-on-insulator (SOI) substrates. In some embodiments, a layer of the substrate 10 may include an insulator such as a semiconductor oxide, a semiconductor nitride, a semiconductor oxynitride, a semiconductor carbide, and/or other suitable insulator materials.

In some embodiments, through-vias may be formed to extend into the semiconductor substrate 10, wherein the through-vias are used to electrically inter-couple the features on opposite sides of semiconductor substrate. Integrated circuit devices, which may include active devices such as transistors and/or passive devices such as capacitors, resistors, or the like, may be formed on an active side of the semiconductor substrate 10.

The conductive layer 12 may be formed of any conductive material, and in some embodiments, may be formed of or include one or more of Co, Ru, or W. In various embodiments, the conductive layer 12 may be patterned by any suitable technique to have any shape or size as may be desired. For example, in some embodiments, the conductive layer 12 may be a conductive line and may have a substantially linear shape that is patterned through conventional photolithography processes or any other suitable process. In some embodiments, the conductive layer 12 is a part of a metal interconnect layer of a semiconductor device.

In some embodiments, the via 14 may be a conductive via, such as a metal via, that electrically couples the conductive layer 12 to one or more features of a semiconductor device. The via 14 may be formed by any suitable technique, including, for example, by a deposition process. The deposition process may be any suitable deposition process for depositing a hard mask layer, including, for example, chemical vapor deposition (CVD), low-pressure chemical vapor deposition (LPCVD), plasma-enhanced chemical vapor deposition (PECVD), plasma vapor deposition (PVD), atomic layer deposition (ALD), or the like.

In some embodiments, the via 14 may extend through one or more layers (not shown) that are on the conductive layer 12 or the substrate 10. For example, in various embodiments, the via 14 may extend through one or more dielectric layers (e.g., semiconductor oxides, semiconductor nitrides, semiconductor oxynitrides, semiconductor carbides, metal oxides, other metal compounds, etc.), metal layers, metal alloy layers, polysilicon layers, or any other material layers which may be present in a semiconductor device.

In some embodiments, a portion of one or more layers on the conductive layer 12 is selectively removed, for example, by etching or any other suitable technique. The via 14 may then be formed in a recess or void where the portion of the one or more layers has been removed, for example, by deposition of a conductive material.

The via 14 may have any shape as may be desired. In some embodiments, as shown in FIG. 1, the via 14 may have a substantially cylindrical shape; however, embodiments of the present disclosure are not limited thereto, and in various embodiments, the via 14 may have a rectangular shape, a tapered shape, a reverse tapered shape, or any other shape.

As shown in FIG. 2, a mask 18 is positioned over the structure including the via 14, the conductive layer 12, and the substrate 10. The mask 18 includes an opening 20, and the opening 20 overlies at least a portion 12a of the conductive layer 12. The mask 18 may be referred to as a cut-metal mask or a cut-metal pattern and is utilized to pattern or cut the conductive layer by selectively removing the portion 12a of the conductive layer 12.

In various embodiments, the mask 18 may be any suitable mask, such as a hard mask, including a masking material used to protect underlying regions (e.g., of the conductive layer 12 and the substrate 10) during processing. Suitable materials for the mask 18 may include dielectric materials (e.g., semiconductor oxides, semiconductor nitrides, semiconductor oxynitrides, semiconductor carbides, metal oxides, other metal compounds, etc.), metals, metal alloys, polysilicon, or other suitable materials. In some embodiments, the mask 18 is a silicon nitride film.

The mask 18 may be formed by any suitable process, including, for example, deposition, anodization, thermal oxidation, or the like. In some embodiments, the mask 18 is formed by a deposition process. The deposition process may be any suitable deposition process for depositing a mask layer, including, for example, chemical vapor deposition (CVD), low-pressure chemical vapor deposition (LPCVD), plasma-enhanced chemical vapor deposition (PECVD), plasma vapor deposition (PVD), atomic layer deposition (ALD), or the like. In some embodiments, the mask 18 is patterned by a patterned photoresist layer (not shown). For example, the mask 18 may be formed by depositing a mask material over the via 14, the conductive layer 12, the substrate 10, and any layers on the substrate 10 and adjacent to the conductive layer 12, and a photoresist may be formed (e.g., via spin coating) over the mask material. The photoresist layer may then undergo a lithography process, which may include one or more steps such as exposing, post-exposure baking, developing, rinsing, or the like to form a patterned photoresist layer, which may then be used to pattern the mask material thereby defining the pattern or shape of the mask 18, including the opening 20.

The mask 18 is positioned over the via 14 and the conductive layer 12, with the opening 20 overlying at least the portion 12a of the conductive layer 12. In some embodiments, the via 14 is at least partially exposed through the opening 20 of the mask 18, as shown in FIG. 2. As will be discussed in further detail herein, the portion 12a of the conductive layer 12 may be removed, and the via 14 may protect underlying portions of the conductive layer 12, so that the conductive layer 12 is self-aligned with the via 14 after the removal of the portion 12a.

Once the mask 18 is positioned as desired over the via 14 and the conductive layer 12, the portion 12a of the conductive layer 12 is selectively removed, for example, by an etching process. The etching process may include, for example, wet etching, dry etching, Reactive Ion Etching (RIE), ashing, or any other suitable etching processes. In some embodiments, the portion 12a of the conductive layer 12 is removed by an etchant (which may be a wet etchant, a plasma etchant, an etchant gas, or the like) having an etchant chemistry that selectively removes the portion 12a of the conductive layer 12 that is exposed through the opening 20, while the via 14 is substantially resistant to the etchant. The conductive layer 12 and the via 14 may be formed of different materials having a different selectivity to the etchant. For example, the etchant may have an etchant chemistry with a high selectivity to the conductive layer 12. For example, an etchant gas may be utilized which removes the conductive layer 12 at a higher etching rate than it removes the via 14. In some embodiments, the portion 12a of the conductive layer 12 is removed by an etchant gas including carbon tetrafluoride ($CF_4$), difluoromethane ($CH_2F_2$), trifluoromethane ($CHF_3$), other suitable etchants, or combinations thereof.

The etching process for removing the portion 12a of the conductive layer 12 may be performed with various etching parameters as may be desired. For example, in some embodiments, the etching process uses a chloride/chlorine base etchant, with an etching bias of between about 50 volts and about 150 volts, and an etching time/duration of between about 100 seconds and about 300 seconds.

As shown in FIG. 3, after the portion 12a of the conductive layer 12 is selectively removed, the conductive layer 12 is separated into a first segment 12b and a second segment 12c that face one another. The first segment 12b has an end profile that is aligned with and has substantially the same shape as the via 14, as the via 14 acts as a mask for the end of the first portion 12b during the removal of the portion 12a as previously discussed.

Figure 4A:
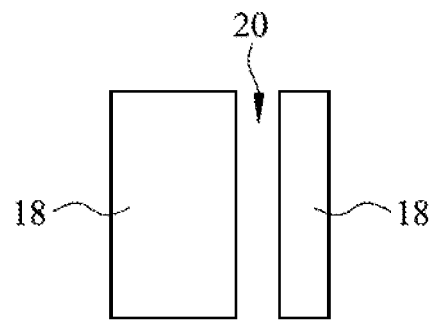
FIG. 4A is a top view illustrating the cut-metal pattern or mask utilized in the method illustrated in FIGS. 1 through 3.
Figure 4B:
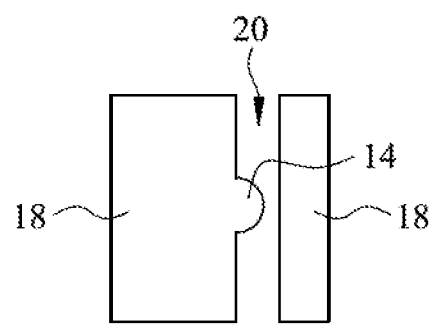
FIG. 4B is a top view illustrating the effective area of the cut-metal pattern or mask, in accordance with some embodiments.

FIG. 4A is a top view illustrating the cut-metal pattern or mask 18, and FIG. 4B is a top view illustrating the effective area of the cut-metal pattern or mask 18, including the masking performed by the via 14. As can be seen from FIGS. 4A and 4B, the via 14 effectively extends the masking area, as the via 14 extends at least partially into the area of the opening 20. Accordingly, the cut process (e.g., the selectively removal of the portion 12a of the conductive layer 12) may be performed on the conductive layer 12 while the conductive layer 12 is confined by the via 14. This results in the via 14 being self-aligned with the end of the first segment 12b of the conductive layer 12. As such, embodiments of the present disclosure have significant advantages over conventional techniques in which the underlying metal or conductive layer has an enclosure budget with respect to the via, such that the metal or conductive layer has a line end that extends laterally outwardly beyond the edge of the via which may be due to cutting the metal or conductive layer prior to forming the via.

Figure 5A:
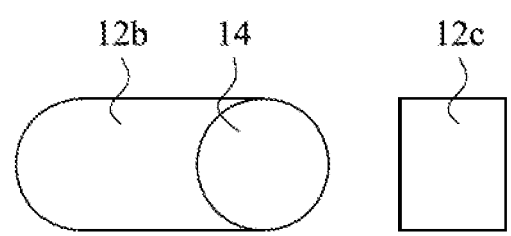
FIG. 5A is a top view and FIG. 5B is a side view illustrating the alignment of the via and the first segment of the conductive layer after performance of the method illustrated in FIGS. 1 through 3, in accordance with some embodiments.
Figure 5B:
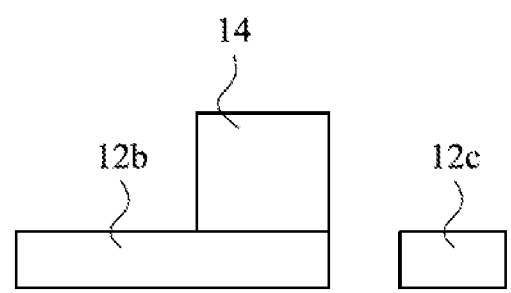

FIG. 5A is a top view illustrating the alignment of the via 14 and the first segment 12b of the conductive layer 12, and FIG. 5B is a side view illustrating the alignment of the via 14 and the first segment 12b of the conductive layer 12. As can be seen from FIGS. 5A and 5B, the via 14 is self-aligned to the line end of the first segment 12b without any enclosure budget (e.g., without portions of the first segment 12b extending laterally outward beyond the edge of the via 14 into the cut region or toward the second segment 12c). In accordance with some embodiments, the first segment 12b may have curved edges that are rounded and may fit to a corresponding rounded or circular edge of the via 14. Moreover, as shown in FIG. 5B, the via 14 and the line end of the first segment 12b together form a smoothly vertical sidewall. The sidewall profile may be changed, such as different angle or bowling, but the present disclosure and the reference to certain etching profile should not be limited to those described. For example, sidewalls of the vias 14 may be tilted up or down with 80 to 90 degrees to bottom surfaces of the via.

FIGS. 6-17D illustrate a method of forming a semiconductor device having a self-aligned via, in accordance with one or more embodiments of the present disclosure. In FIGS. 6-17D, the Figures labeled "A" are top views, and the Figures labeled "B", "C", and "D" are cross-sectional views taken along respective cut-lines illustrated in the top views. However, it is noted that all of the features of the corresponding structure are not necessarily depicted in these views; rather, the cross-sectional and top views may illustrate only portions or features of the structures relevant to description of the formation of the vias, and other structures or features may be omitted from the cross-sectional and top views.

Figure 6:
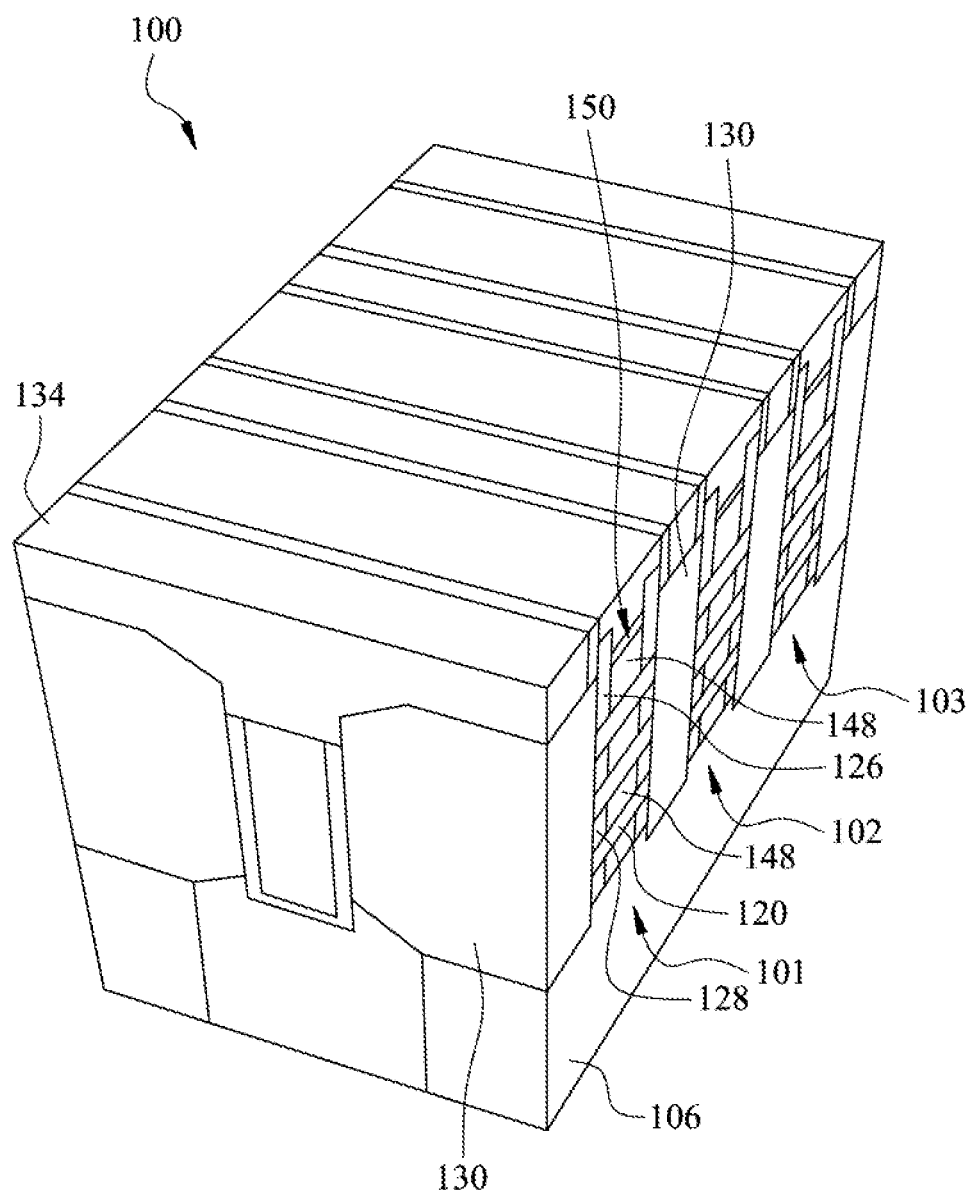
FIGS. 6 through 17D illustrate a method of fabricating a semiconductor device having a self-aligned via, in accordance with some embodiments of the present disclosure.

As shown in FIG. 6, a semiconductor device structure 100 includes a first transistor 101, a second transistor 102, and a third transistor 103 which have been formed over a semiconductor substrate 106. The first, second, and third transistors 101-103 may have the same or substantially similar structures. Accordingly, while reference numbers are provided primarily for the structures of the first transistor 101, the second and third transistors 102, 103 may have identical or comparable structures.

In some embodiments, the first transistor 101 may be a gate-all-around (GAA) transistor. The transistor 101 includes a plurality of semiconductor nanosheets 120 or nanowires. The semiconductor nanosheets 120 are layers of semiconductor material. The semiconductor nanosheets 120 correspond to the channel regions of the transistor 101. The semiconductor nanosheets 120 are formed over the substrate 106, and may be formed on the semiconductor substrate 106. The semiconductor nanosheets 120 may include one or more layers of Si, Ge, SiGe, GaAs, InSb, GaP, GaSb, InAlAs, InGaAs, GaSbP, GaAsSb or InP. In some embodiments, the semiconductor nanosheets 120 are formed of the same semiconductor material as the substrate 106. Other semiconductor materials can be utilized for the semiconductor nanosheets 120 without departing from the scope of the present disclosure.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In some embodiments, the semiconductor nanosheets 120 are formed by alternating epitaxial growth processes from the substrate 106. For example, a first epitaxial growth process may result in the formation a sacrificial semiconductor nanosheet on the top surface of the substrate 106. A second epitaxial growth process may result in the formation of a semiconductor nanosheet 120 on the sacrificial semiconductor nanosheet. Alternating epitaxial growth processes may be performed until a selected number of semiconductor nanosheets 120 and sacrificial semiconductor nanosheets have been formed.

After formation of the semiconductor nanosheets 120 and the sacrificial nanosheets between the semiconductor nanosheets 120, the sacrificial nanosheets may be removed. Removal of the sacrificial nanosheets results in gaps between the semiconductor nanosheets 120.

As shown in FIG. 6, the transistor 101 may have four semiconductor nanosheets 120. However, in practice, the transistor 101 may have other numbers of semiconductor nanosheets 120 than four. For example, the transistor 101 may include between 2 and 10 semiconductor nanosheets 120 in some embodiments. Other numbers of semiconductor nanosheets 120 can be utilized without departing from the scope of the present disclosure.

The semiconductor nanosheets 120 can have thicknesses between 2 nm and 100 nm. In some embodiments, the semiconductor nanosheets 120 have thicknesses between 2 nm and 20 nm. This range provides suitable conductivity through the semiconductor nanosheets while retaining a low thickness. In some embodiments, each nanosheet 120 is thicker than the semiconductor nanosheet(s) 120 above it. The semiconductor nanosheets 120 can have other thicknesses without departing from the scope of the present disclosure.

In some embodiments, a bottom dielectric layer (not shown) may be positioned between the bottom semiconductor nanosheet 120 and the substrate 106. The bottom dielectric layer may include silicon nitride or another suitable material.

A sheet inner spacer layer 128 is located between the semiconductor nanosheets 120. The sheet inner spacer layer 128 can be deposited by an ALD process, a CVD process, or other suitable processes. In one example, the sheet inner spacer layer 128 includes silicon nitride.

The semiconductor nanosheets 120 extend between source and drain regions 130. The source and drain regions 130 include semiconductor material. In some embodiments, the source and drain regions 130 may be grown epitaxially from the semiconductor nanosheets 120 or from the substrate 106. The source and drain regions 130 may be doped with N-type dopants species in the case of N-type transistors. The source and drain regions 130 may be doped with P-type dopant species in the case of P-type transistors. The doping can be performed in-situ during the epitaxial growth. While the source and drain regions 130 are labeled with a common reference number and title, in practice, the transistor 101 will have a source region and a separate drain region. For example, the region 130 on the left of the transistor 101 may correspond to a source of the transistor 101 and the region 130 on the right of the transistor 101 may correspond to a drain of the transistor 101. Alternatively, the drain may be on the left and the source may be on the right.

A gate structure 150 is positioned overlying the stack of semiconductor nanosheets 120. In some embodiments, the gate structure 150 includes a gate spacer 126 is positioned on sidewalls of a gate electrode trench formed over the semiconductor nanosheets 120. The gate spacer 126 may include SiCON in some embodiments. The gate spacer 126 can be deposited by CVD, PVD, or ALD. Other materials and deposition processes can be utilized for the gate spacer 126 without departing from the scope of the present disclosure.

Though not shown in FIG. 6, a thin interfacial dielectric layer may be formed on the surfaces of the semiconductor nanosheets 120. The interfacial dielectric layer can include a dielectric material such as silicon oxide, silicon nitride, or other suitable dielectric materials. The interfacial dielectric layer can be formed by a thermal oxidation process, a CVD process, or an ALD process. The interfacial dielectric layer can have a thickness between 0.5 nm and 2 nm. Other materials, deposition processes, and thicknesses can be utilized for the interfacial dielectric layer without departing from the scope of the present disclosure.

The interfacial dielectric layer surrounds the semiconductor nanosheets 120. In particular, the semiconductor nanosheets 120 may have a shape corresponding to a slat or wire extending between the source and drain regions 130. The interfacial dielectric layer wraps around each semiconductor nanosheet 120. The interfacial dielectric layer surrounds or partially surrounds the semiconductor nanosheets 120.

Though not shown in FIG. 6, a high-K gate dielectric layer may be formed on the interfacial dielectric layer, on the sidewalls of the gate spacers 126, and on the sidewalls of the sheet inner spacers 128. Together, the high-K gate dielectric layer and the interfacial dielectric layer correspond to a gate dielectric of the transistor 101. The high-K dielectric layer surrounds or partially surrounds the semiconductor nanosheets 120 in the same way as described in relation to the interfacial dielectric layer, except that the interfacial dielectric layer is between the semiconductor nanosheets 120 and the high-K gate dielectric layer.

The high-K gate dielectric layer may include one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, or combinations thereof. The high-K gate dielectric layer may be formed by CVD, ALD, or any suitable method. In some embodiments, the high-K gate dielectric layer is formed using a highly conformal deposition process such as ALD in order to ensure the formation of a gate dielectric layer having a uniform thickness around each semiconductor nanosheet 120. In some embodiments, the thickness of the high-K dielectric layer is in a range from about 1 nm to about 4 nm. Other thicknesses, deposition processes, and materials can be utilized for the high-K gate dielectric layer without departing from the scope of the present disclosure.

A gate electrode 148 fills the remaining space between the semiconductor nanosheets 120 and the trench above the semiconductor nanosheets 120 between the gate spacers 126. The gate electrode 148 may include multiple individual layers of gate metals. The materials and thicknesses of the various layers of gate metals can be selected to provide a desired threshold voltage of the transistor 101.

In some embodiments, the gate electrode 148 includes a metal layer and a gate fill material positioned on the metal layer in the trench and between semiconductor nanosheets 120. In one example, the gate fill material includes tungsten. The gate fill material can be deposited using PVD, ALD, CVD, or, other suitable deposition processes. The gate fill material fills the remaining space in the trench and between semiconductor nanosheets 120. The gate fill material is highly conductive.

The metal layer and the gate fill material surround or partially surround the semiconductor nanosheets 120 in the same way as described above in relation to the interfacial dielectric layer and the high-K gate dielectric layer, except that the interfacial dielectric layer and the high-K gate dielectric layer are positioned between the semiconductor nanosheets 120 and the metal layer and gate fill material.

In some embodiments, a conductive layer 134 is formed on the source and drain regions 130 of each of the first, second, and third transistors 101-103. The conductive layer 134 may be an interconnect metal which connects the source and drain regions 130 to one or more vias which will be described in further detail later herein. In various embodiments, the conductive layer 134 may be formed of any conductive material.

Figure 7A:
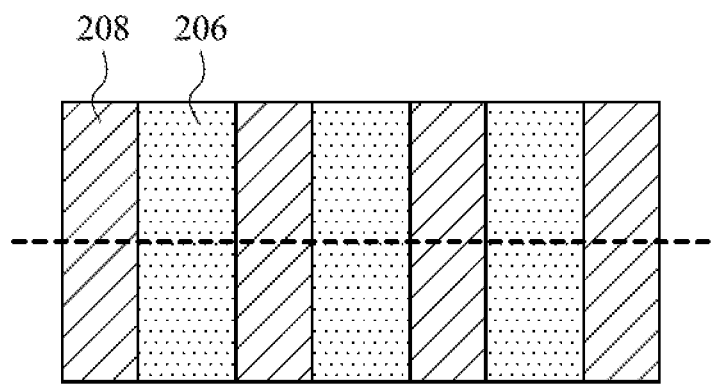
Figure 7B:
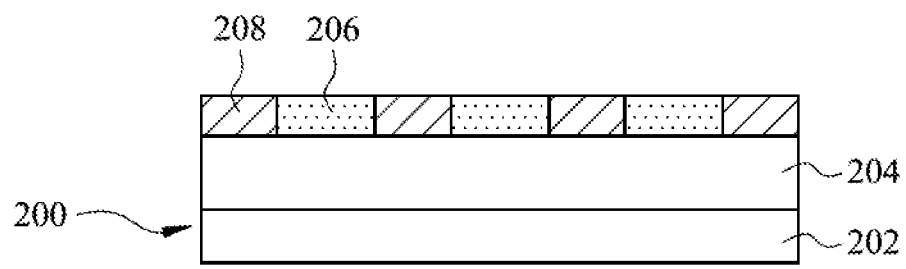

As shown in FIGS. 7A and 7B, a semiconductor device structure 200 may include a wafer 202 and a semiconductor substrate 204 on the wafer 202. In some embodiments, the wafer 202 is a semiconductor wafer. The semiconductor device structure 200 may include various electrical features or devices. In some embodiments, the semiconductor device structure 200 includes one or more semiconductor devices, such as finFET devices, nanosheet transistors or nanosheet semiconductor devices, or the like. In some embodiments, the semiconductor device structure 200 includes one or more conductive wiring layers, interconnect layers, bottom interconnect layers, or the like. In some embodiments, the semiconductor device structure 200 may be or include the semiconductor device structure 100 described with respect to FIG. 6.

A first dielectric layer 206 and a first conductive layer 208 may be formed on the semiconductor device 200, as shown in FIG. 7B. In some embodiments, the first conductive layer 208 may correspond to the conductive layer 134 of the semiconductor device structure 100 shown in FIG. 6.

The first dielectric layer 206 and the conductive layer 208 are formed in an alternating sequence, with portions of the first dielectric layer 206 being alternately arranged between portions of the conductive layer 208. The first dielectric layer 206 and the conductive layer 208 may be formed by any suitable technique, including, for example, by deposition, standard photolithography processing steps, etching, metal etching, chemical-mechanical planarization (CMP), or the like.

The first dielectric layer 206 may include any suitable dielectric material. In some embodiments, the first dielectric layer 206 may be a low-k dielectric layer. In some embodiments, the first dielectric layer 206 may be an oxide layer. In some embodiments, the first dielectric layer 206 may include silicon oxide.

Figure 8A:
Figure 8B:
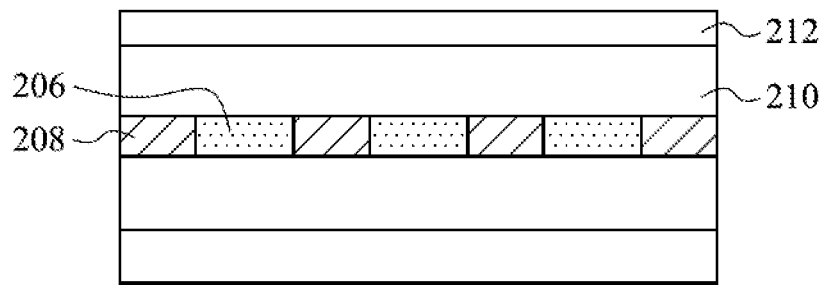

As shown in FIGS. 8A and 8B a second dielectric layer 210 is formed over the first dielectric layer 206 and the conductive layer 208, and a resist or photoresist layer 212 is formed over the second dielectric layer 210. The second dielectric layer 210 may include any suitable dielectric material. In some embodiments, the second dielectric layer 210 may be a low-k dielectric layer. In some embodiments, the second dielectric layer 210 may be an oxide layer. In some embodiments, the second dielectric layer 210 may include silicon oxide. In some embodiments, the first and second dielectric layers 206, 210 may be formed of a same material.

In some embodiments, the resist layer 212 may be a single or a multi-layer structure, which may be selected as desired depending upon design considerations such as patterning and etching steps to be performed via the resist layer 212.

Figure 9A:
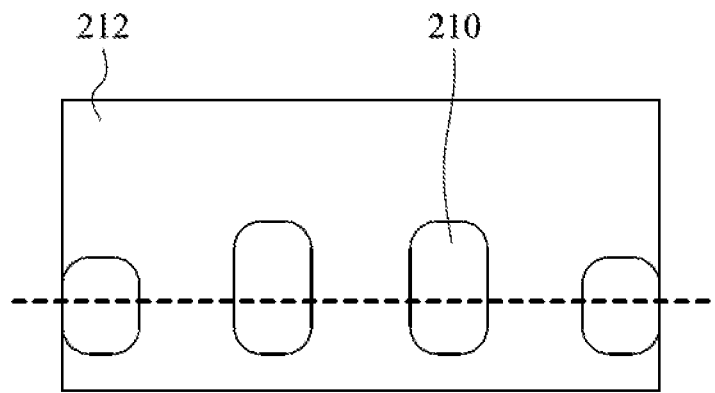
Figure 9B:
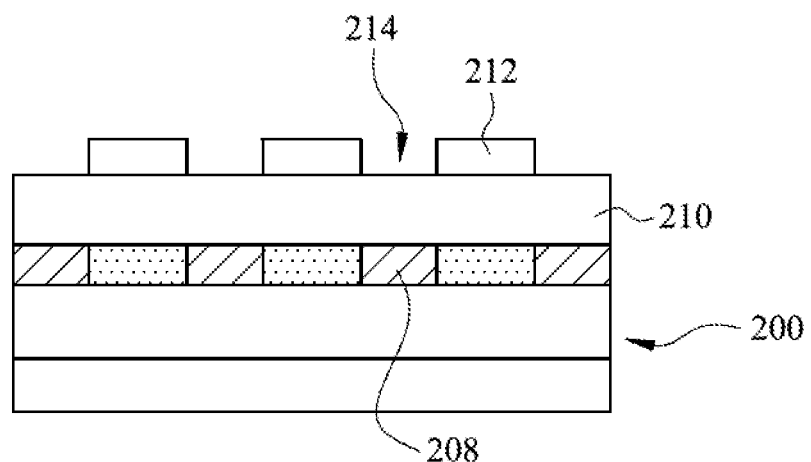

As shown in FIGS. 9A and 9B, openings 214 are formed in the resist layer 212 by selectively removing portions of the resist layer 212 corresponding to the openings 214. The openings 214 may be formed by any suitable technique, including, for example, by developing and selectively etching the resist layer 212 via standard photolithography processes. The openings 214 may correspond to a via pattern to be formed on the semiconductor device structure 200. The openings 214 may extend through the resist layer 212 and expose portions of the second dielectric layer 210, as shown. In some embodiments, the openings 214 may overlie and be aligned with (e.g., vertically aligned with) portions of the conductive layer 208.

Figure 10A:
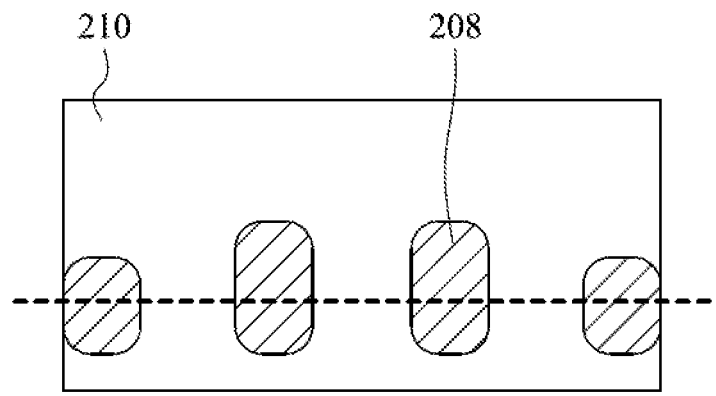
Figure 10B:
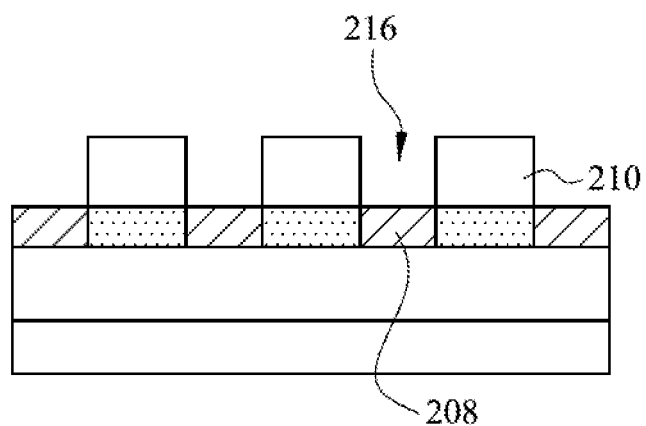

As shown in FIGS. 10A and 10B, cavities 216 are formed extending through the second dielectric layer 210. The cavities 216 at least partially expose portions of the conductive layer 208. In some embodiments, the cavities 216 may at least partially expose portions of the conductive layer 134 on each of the source and drain regions 130 of the semiconductor device structure 100 of FIG. 6.

The cavities 216 may be formed by any suitable process. In some embodiments, the cavities 216 are formed by a photolithography and etching process, which defines the cavities 216, for example, by selectively etching and removing portions of the second dielectric layer 210. The cavities 216 may be formed to have any shape as may be desired, and the shape of the cavities 216 in some embodiments may define the shape of the later formed via. In some embodiments, the cavities 216 may have a substantially cylindrical or oval shape; however, embodiments of the present disclosure are not limited thereto, and in various embodiments, the cavities 216 may have a rectangular shape, a tapered shape, a reverse tapered shape, or any other shape.

Figure 11A:
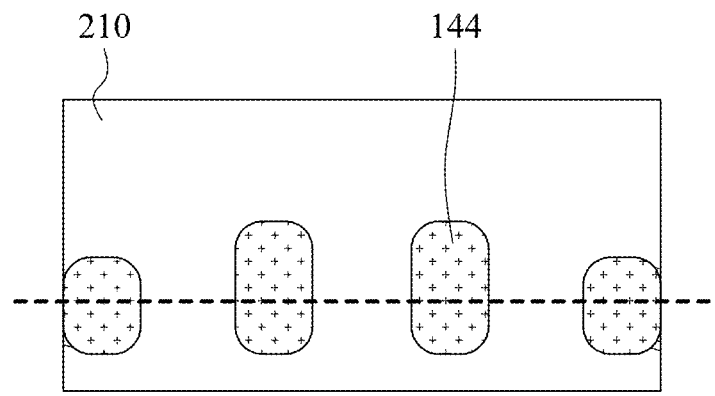
Figure 11B:
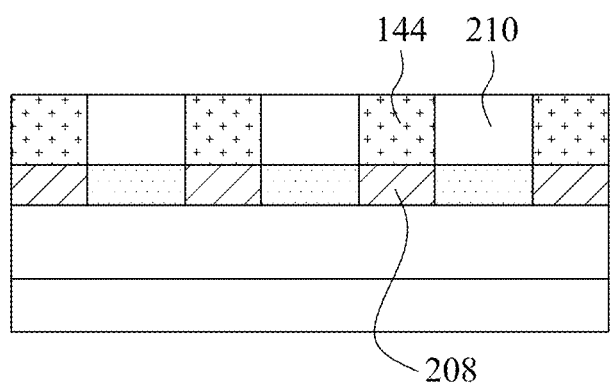
Figure 12A:
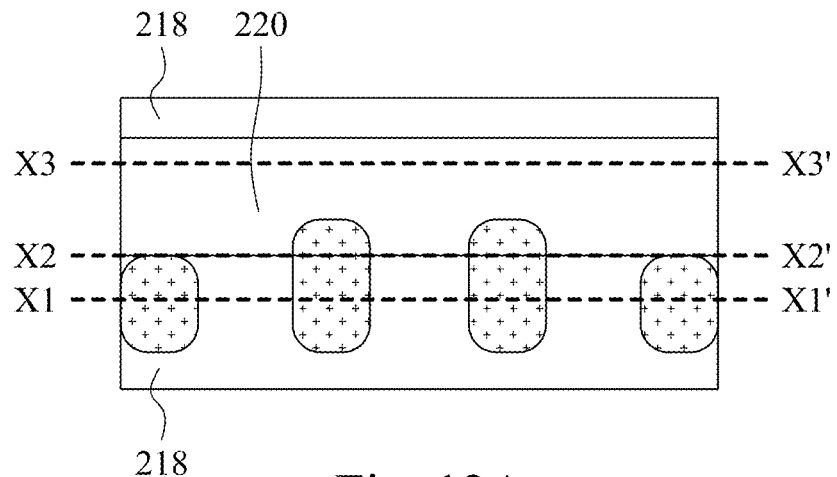
Figure 12B:
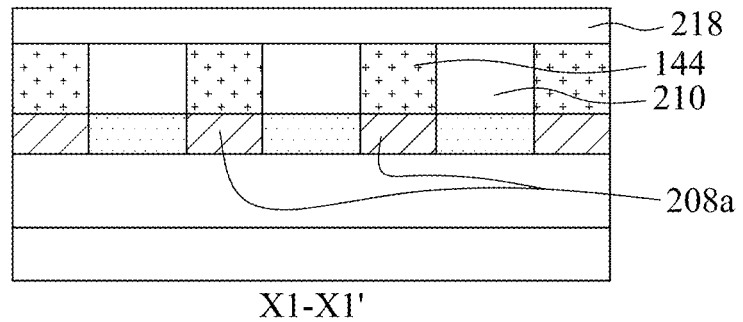
Figure 12C:
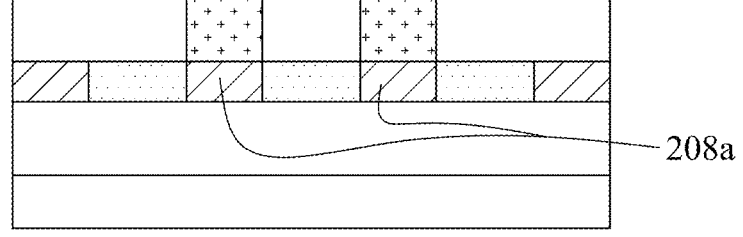
Figure 12D:
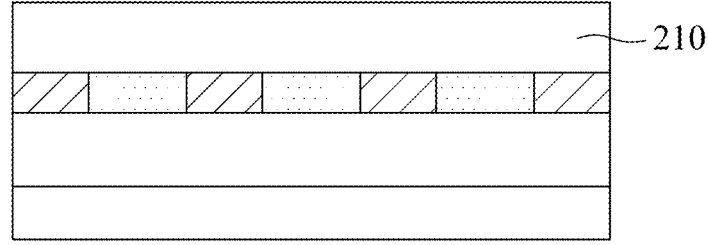

As shown in FIGS. 11A and 11B, a dummy material (dummy via or mask via) 144 may be formed within the cavities 216 and may fill the cavities 216. The dummy material 144 may extend through each of the cavities 216 and may contact the underlying portions of the conductive layer 208. The dummy material 144 may be formed to fill the cavities 216 by any suitable technique, including, for example, by a deposition process. The deposition process may be any suitable deposition process layer, including, for example, chemical vapor deposition (CVD), low-pressure chemical vapor deposition (LPCVD), plasma-enhanced chemical vapor deposition (PECVD), plasma vapor deposition (PVD), atomic layer deposition (ALD), or the like. The dummy material 144 may be any suitable dummy material. In some embodiments, the dummy material 144 may be a dielectric material. In some embodiments, the dummy material may include one or more of SiCN, SiOCN, SiOC, AlOx, AlN, AlCN, TIN, TiO, or any other suitable dummy material.

In some embodiments, a chemical-mechanical planarization (CMP) process is performed on a surface of the dummy material 144 and the second dielectric layer 210 (e.g., on an upper surface thereof) to planarize the surface of the dummy material 144 and the second dielectric layer 210.

As shown in FIGS. 12A, 12B, 12C, and 12D, a mask 218 is positioned over the structure shown in FIGS. 11A, and 11B. The mask 218 may be the same or substantially similar as the mask 18 previously described herein. For example, the mask 218 may include an opening 220 that overlies at least a portion 208a of each of the conductive layers 208, as shown in the cross-sectional view of FIG. 12B, which is taken along the cut-line X2-X2'. The mask 218 may be a cut-metal mask or a cut-metal pattern and is utilized to pattern or cut the conductive layer 208 by selectively removing the portions 208a of the conductive layer 208. In some embodiments, the mask 218 is a hard mask or a resist layer that is formed on the second dielectric layer 210 and the dummy layer 144 by a deposition process, and patterned to form the opening 220, for example, by a photolithography and etching process.

Figure 13A:
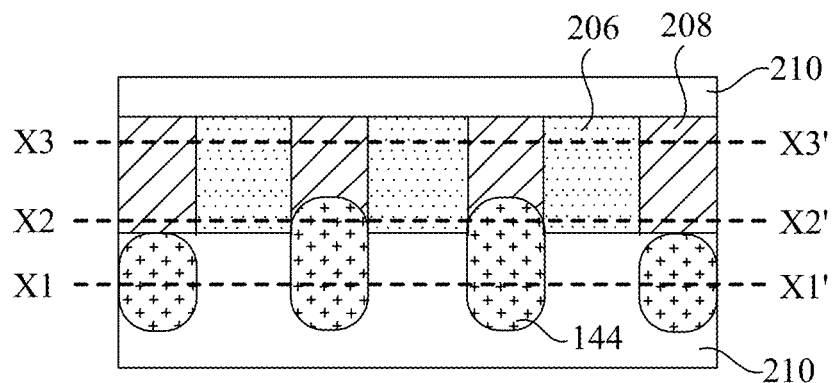
Figure 13B:
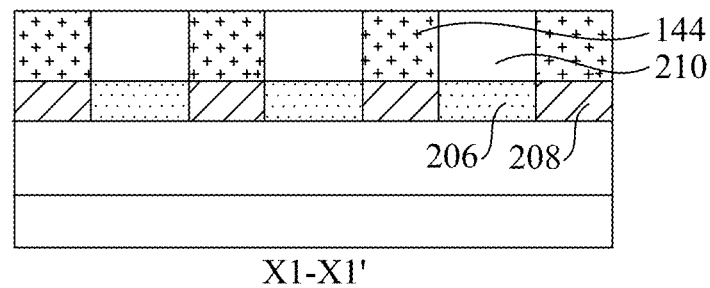
Figure 13C:
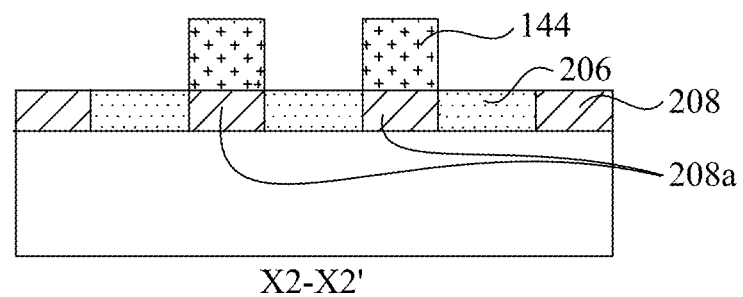
Figure 13D:
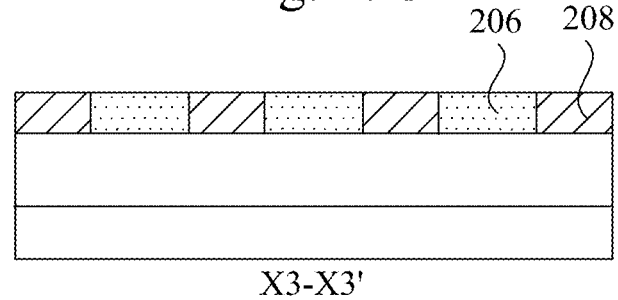

As shown in FIGS. 13A, 13B, 13C, and 13D, portions of the second dielectric layer 210 exposed through the opening 220 of the mask 218 are selectively removed, for example, by an etching process. In some embodiments, the opening 220 overlies at least a portion of the dummy material 144, for example, as shown in the cross-sectional view of FIG. 13C, which is taken along the cut-line X2-X2'. The etching process may be a dielectric film etching process in which an etchant is utilized that selectively removes the portions of the second dielectric layer 210 exposed through the opening 220, but does not remove exposed portions of the dummy material 144 in the opening 220. The mask 218 may be removed, as shown. As shown in FIG. 13C, which is taken along the cut-line X2-X2', the second dielectric layer 210 remains in the regions which were covered by the mask 218.

Figure 14A:
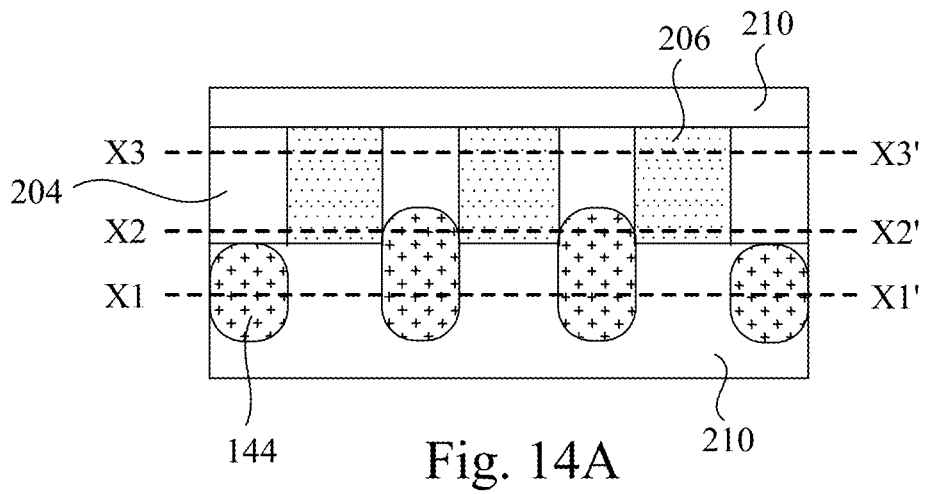
Figure 14B:
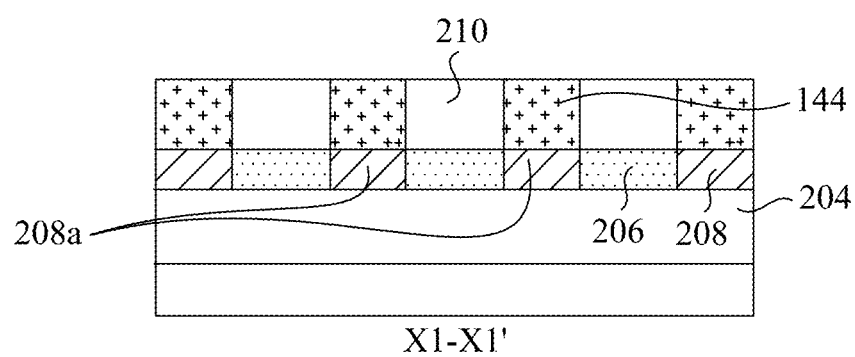
Figure 14C:
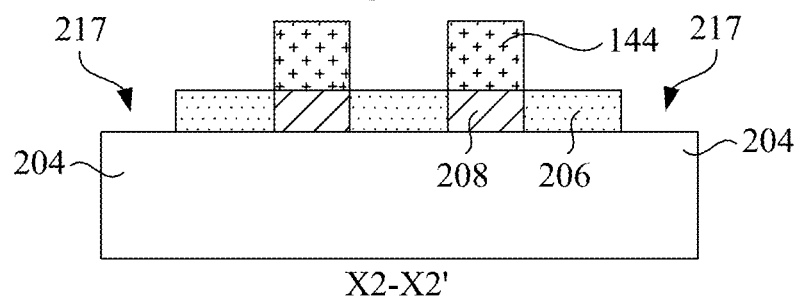
Figure 14D:
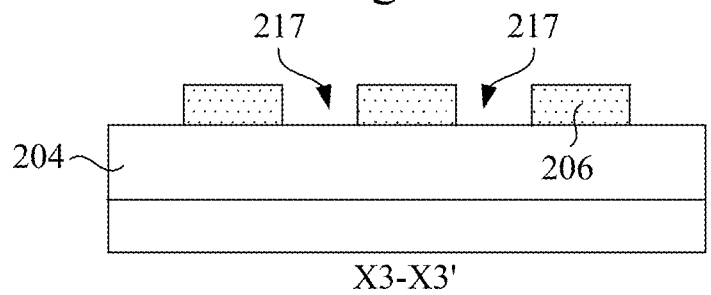
Figure 15A:
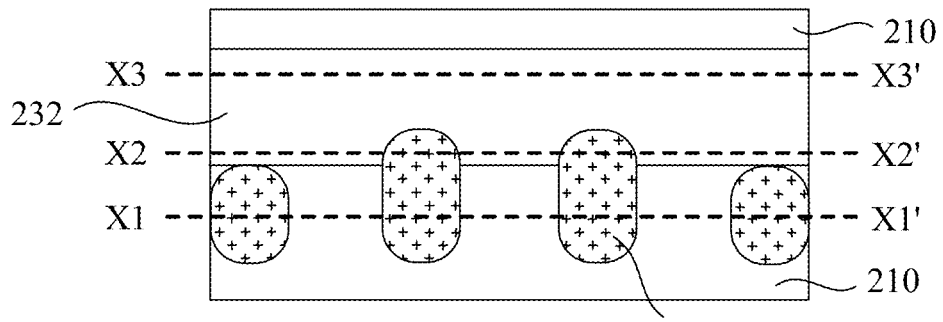
Figure 15B:
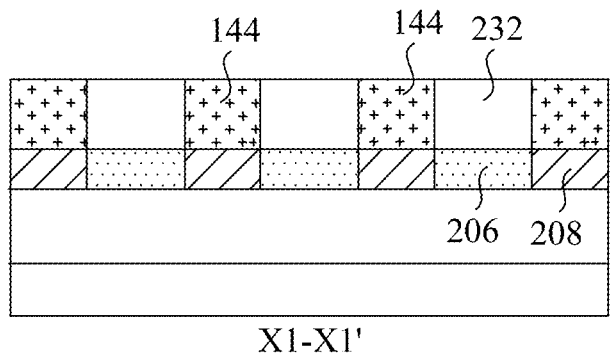
Figure 15C:
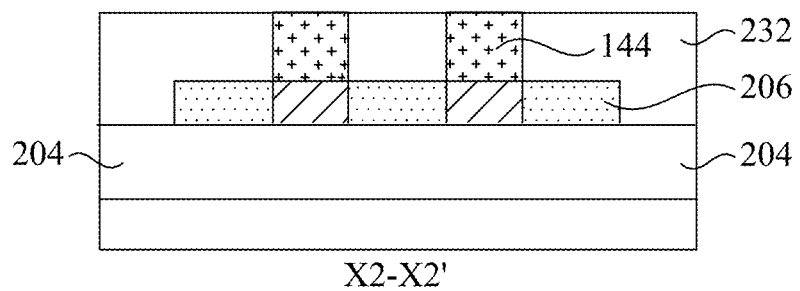
Figure 15D:
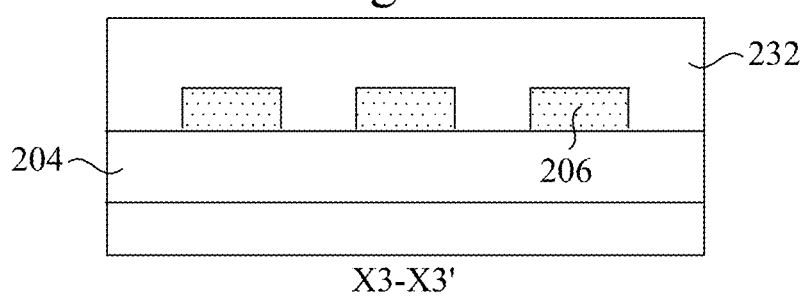
Figure 16A:
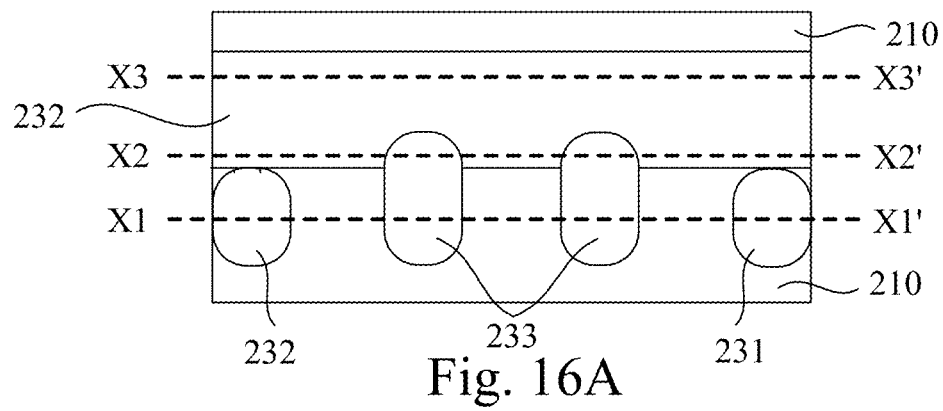
Figure 16B:
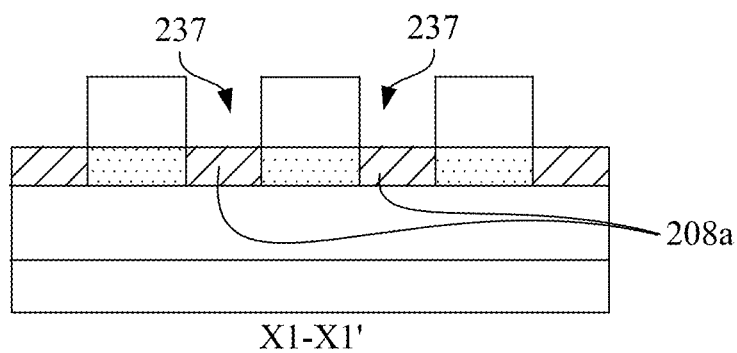
Figure 16C:
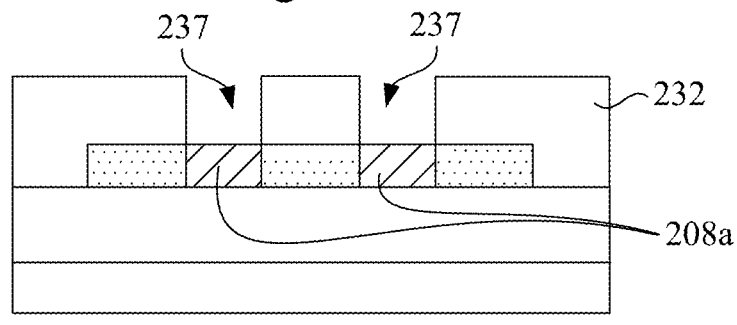
Figure 16D:
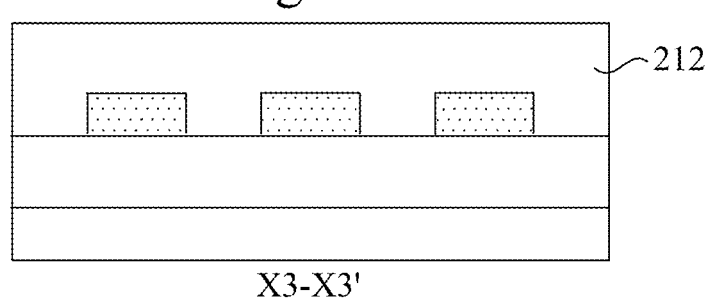
Figure 17A:
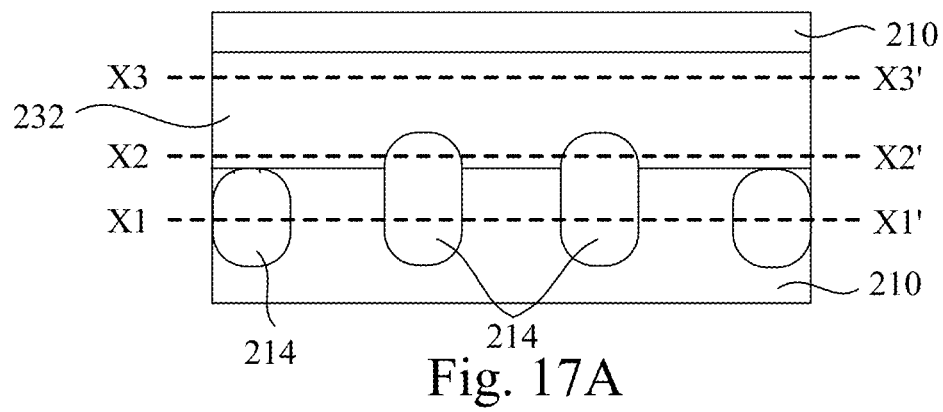
Figure 17B:
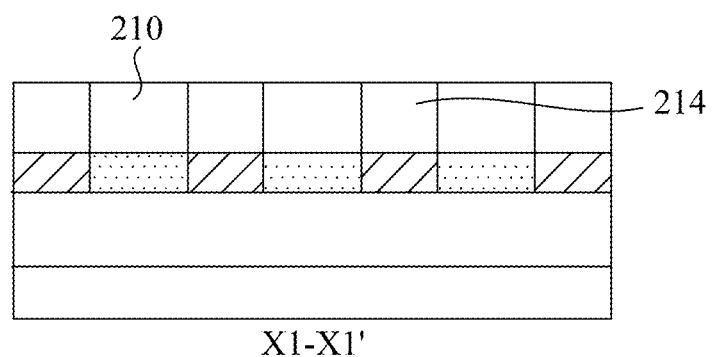
Figure 17C:
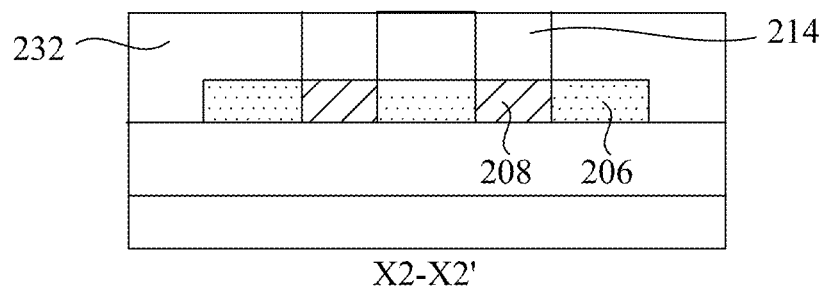
Figure 17D:
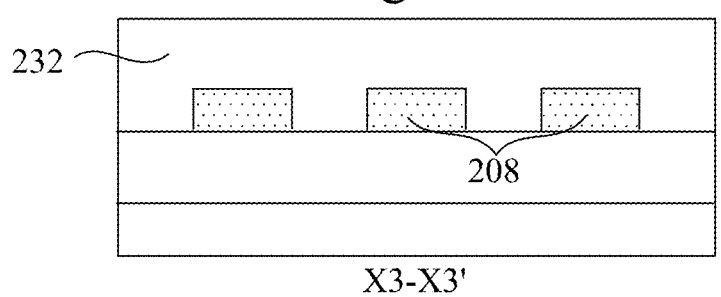

As shown in FIGS. 14A, 14B, 14C, and 14D, portions of the conductive layer 208 are selectively removed. For example, as shown in FIGS. 14C and 14D, cavities 217 are formed by selectively removing exposed portions of the conductive layer 208. In some embodiments, the cavities 217 may at least partially expose underlying portions of the semiconductor substrate 204.

The cavities 217 may be formed by any suitable process. In some embodiments, the cavities 217 are formed by a metal etching process, which defines the cavities 217, for example, by selectively etching and removing portions of the conductive layer 208. The cavities 217 may be formed to have any shape as may be desired.

As shown in FIGS. 14C and 14D, portions 208a of the conductive layer 208 underlying the dummy material 144 are retained after the etching process. That is, the portions 208a of the conductive layer 208 are protected by the overlying dummy material 144 and therefore are not removed by the etching process. The portions 208a of the conductive layer 208 may have a substantially same shape (e.g., in top view) as that of the dummy material 144 after the etching process.

In some embodiments, the dummy material 144 is a different material than the material of the conductive layer 208. In some embodiments, the dummy material 144 is a non-conductive material. In some embodiments, the cavities 217 are formed by removing portions of the conductive layer 208 by an etchant (which may be a wet etchant, a plasma etchant, an etchant gas, or the like) having an etchant chemistry that selectively removes the portions of the conductive layer 208 that were aligned with the opening 220 and patterned, while the dummy material 144 is substantially resistant to the etchant. The conductive layer 208 and the dummy material 144 may be formed of different materials having a different selectivity to the etchant. For example, the etchant may have an etchant chemistry with a high selectivity to the conductive layer 208. For example, an etchant gas may be utilized which removes the conductive layer 208 at a higher etching rate than it removes the dummy material 144. Accordingly, after forming the cavities 217 by removal of the portions of the conductive layer 208 by etching, the dummy material 144 may have a substantially same size and shape as before the etching.

As shown in FIGS. 15A, 15B, 15C, and 15D, a third dielectric layer 232 is formed on the exposed portions of the semiconductor substrate 204 on the first dielectric layer 206, e.g., in the cavities 217. In some embodiments, the third dielectric layer 232 may be formed of a same material as the first dielectric layer 206.

In some embodiments, a chemical-mechanical planarization (CMP) process is performed on a surface of the dummy material 144, the first dielectric layer 206, and the third dielectric layer 232 (e.g., on an upper surface thereof) to planarize the surface after formation of the third dielectric layer 232.

As shown in FIGS. 16A, 16B, 16C, and 16D, cavities 237 are formed by removing the dummy material 144. The cavities 237 may be formed by any suitable process. In some embodiments, the cavities 237 are formed by an etching process, which defines the cavities 237, for example, by selectively etching and removing portions of the dummy material 144. The cavities 237 may be formed to have any shape as may be desired. The removal of the dummy material 144 exposes surfaces of the portions 208a of the conductive layer 208.

As shown in FIGS. 17A, 17B, 17C, and 17D, the vias 214 formed in the cavities 237. The vias 214 may be formed by any suitable technique, including by deposition or any other suitable processes.

The vias 214 may be formed of any conductive material. In some embodiments, the vias 214 may include one or more of Co, Ru, or W. A chemical-mechanical planarization (CMP) process may be performed on a surface of the vias 214, the first dielectric layer 206, the second dielectric layer 210, and the third dielectric layer 232 (e.g., on an upper surface thereof) to planarize the surface after formation of the vias 214.

Accordingly, at the completion of the process shown in FIGS. 17A, 17B, 17C, and 17D, the vias 214 are self-aligned with the line ends of the underlying portions 208a of the conductive layer 208. The vias 214 thus provide an electrical connection between one or more features (not shown) which may be formed on the semiconductor substrate 204, for example, such as the source and drain regions 130 of the semiconductor device structure 100 shown in FIG. 6.

As previously explained with respect to FIGS. 5A and 5B, the vias 214 may be self-aligned to the line ends of the first segments 134b without any enclosure budget, and the vias 214 and the line ends of the first segments 134b together form smoothly vertical sidewalls. In some embodiments, one or more of the vias 214 may be staggered or offset with respect to a different one of the vias 214. In some embodiments, one or more of the vias 214 may be self-aligned to the line ends of an associated first segment 134b without any enclosure budget, while one or more offset vias may have an associated enclosure budget.

While the process illustrated in FIGS. 6-17D is described as including the dummy material 144, in some embodiments, the dummy material 144 may be omitted from the process. For example, in some embodiments, the vias 214 may be formed directly in the cavities 216 (see FIG. 10B) prior to placement of the mask 218. In such embodiments, the vias 214 may be formed of any conductive material having an etching selectivity that is different from an etching selectivity of the conductive layer 208. As such, the cavities 217 (see FIGS. 14C and 14D) may be formed by selectively removing the portions of the conductive layer 208 by an etchant having an etchant chemistry that selectively removes the portions of the conductive layer 208 that are aligned with the opening 220, while the vias 214 are substantially resistant to the etchant. The third dielectric layer 232 may then be formed in the cavity 217 after the self-aligned vias 214 have been formed.

Figure 18A:
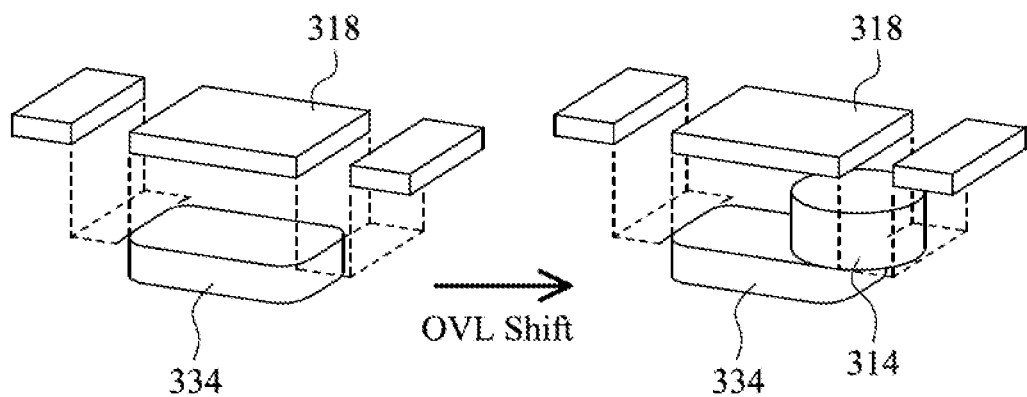
FIG. 18A is a comparative example illustrating the effect of an overlay shift between a via and a cut-metal pattern.
Figure 18B:
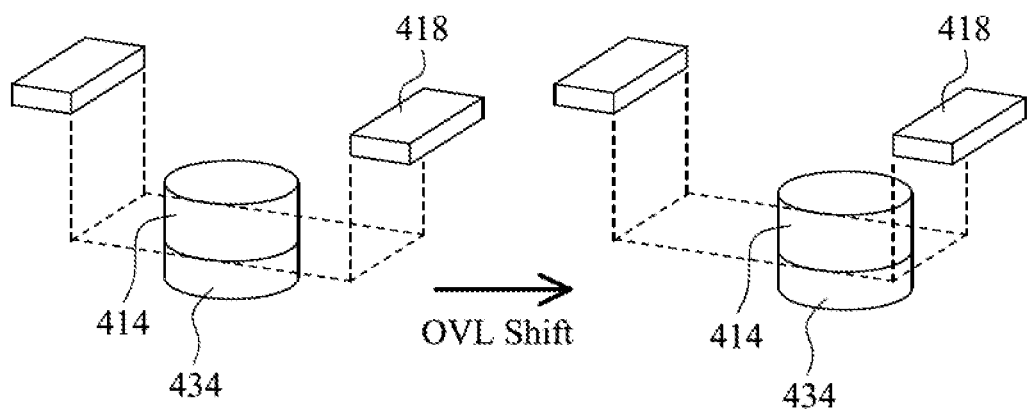
FIG. 18B illustrates the effect of an overlay shift between a via and a cut-metal pattern in accordance with embodiments of the present disclosure.

FIG. 18A is a comparative example illustrating the effect of an overlay shift between a via and a cut-metal pattern, and FIG. 18B illustrates the effect of an overlay shift between a via and a cut-metal pattern in accordance with embodiments of the present disclosure.

In the comparative example illustrated in FIG. 18A, the cut metal process is performed to define line ends of the conductive layer 334 prior to formation of the via 314 on the conductive layer 334. Accordingly, if there is an overlay shift between the via 314 and the cut-metal pattern 318, a via landing failure may be experienced by the via 314, since the via 314 may be formed within on a region of the conductive layer 334 that was shifted due to the overlay shift. This may be due to an overlay shift in the formation of the via 314 (e.g., the via 314 is shifted with respect to an intended position of the via 314) or an overlay shift in the cut-metal pattern 318 (e.g., the cut-metal pattern 318 is shifted with respect to an intended position of the cut-metal pattern 318), and in either scenario the result may be formation of the via 314 extending at least partially over a cut portion (e.g., removed portion) of the conductive layer 334.

In contrast, as shown in FIG. 18B, in embodiments of the present disclosure, the via 414 remains self-aligned with the conductive layer 434 even in the event of an overlay shift between the via 414 and the conductive layer 434. This is due to the formation of the self-aligned via 414 as described herein. For example, since the via 414 is formed before the conductive layer 434 is selectively removed (e.g., by etching), the via 414 and the conductive layer 434 are self-aligned, and additional enclosure budget is not needed. Thus, the via 414 has a higher tolerance for overlay shifts without causing landing errors.

Figure 19A:
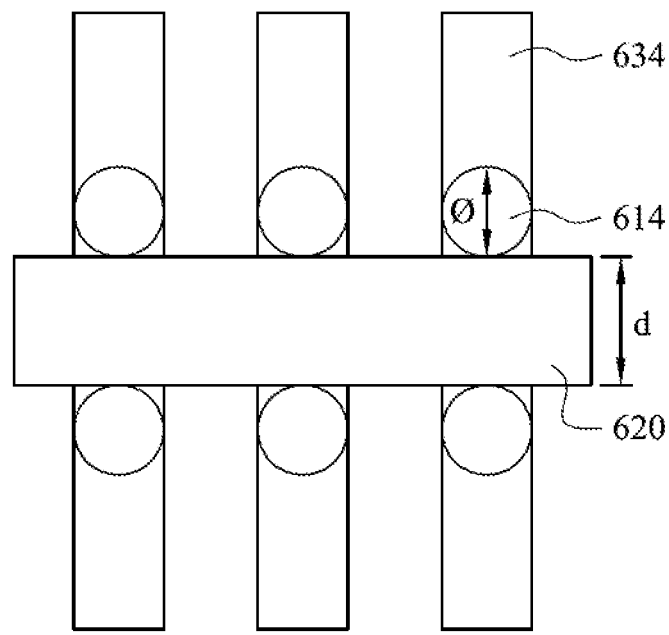
FIG. 19A is a comparative example illustrating the pitch between a vias.
Figure 19B:
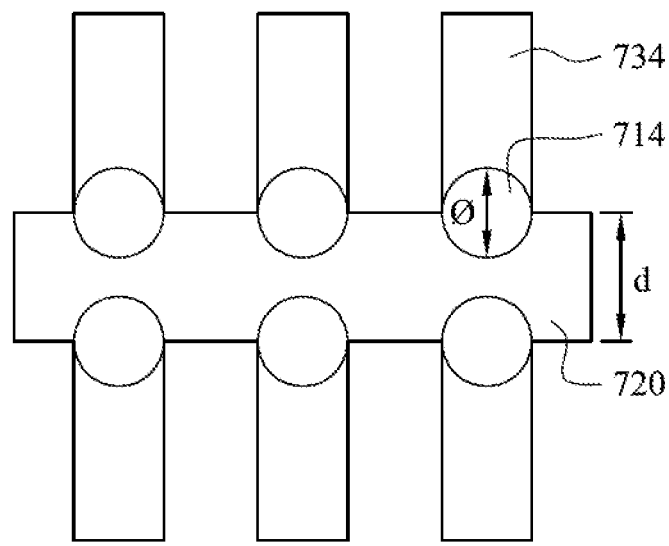
FIG. 19B illustrates the pitch between vias that may be obtained in accordance with embodiments of the present disclosure.

FIG. 19A is a comparative example illustrating the pitch between a vias, and FIG. 19B illustrates the pitch between vias that may be obtained in accordance with embodiments of the present disclosure.

In the comparative example illustrated in FIG. 19A, the vias 614 are formed on the conductive layer 634 prior to cutting of the conductive layer 634 through the opening 620 of a cut metal layer. As such, the underlying conductive layer 634 has an enclosure budget with respect to the vias 614, such that the conductive layer 634 has line ends that extend laterally outwardly beyond the edge of the vias 614. The minimum via pitch, which may be measured as a distance between center points of each of the vias 614 in a direction across the opening 620, is equal to the distance (d) across the opening 620 plus a length of the vias 614 (Ø) (which in the case of a circular or cylindrical via, may be a diameter). In some embodiments, the vias 614 (Ø) may be equal to or less than 50 nm. The distance (d) may be between 10 to 50 nm or larger.

In contrast, as shown in FIG. 19B, in embodiments of the present disclosure, the vias 714 are self-aligned with the underlying line ends of the conductive layer 734. Accordingly, portions of the vias 714 may protrude into the region of the opening 720 of the cut-metal layer. As such, the minimum via pitch may be reduced with respect to the minimum pitch shown in FIG. 19A. More particularly, the minimum via pitch between the vias 714 in accordance with embodiments of the present disclosure may be equal or substantially equal to the distance (d) across the opening 720. In some embodiments, the pitch between the vias 714 may be equal to or less than 50 nm. In some embodiments, the pitch between the vias 714 may be equal to or less than 30 nm.

Figure 20A:
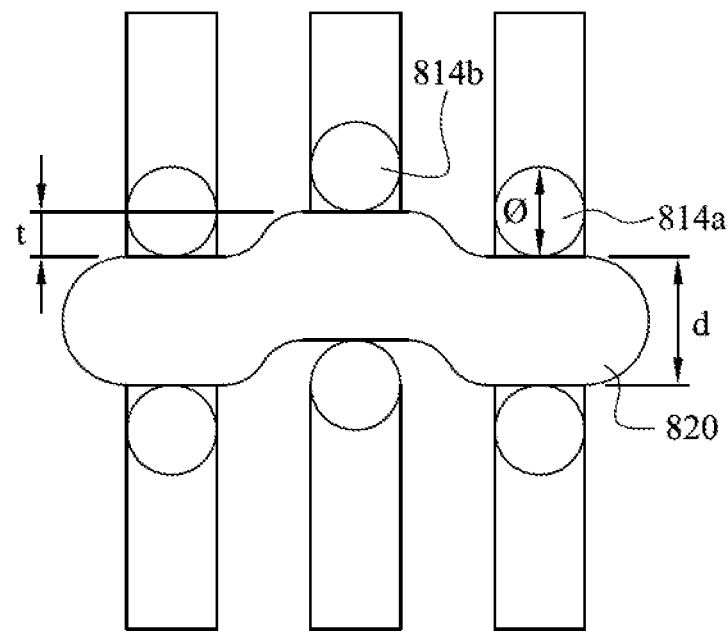
FIG. 20A is a comparative example illustrating formation of offset vias.
Figure 20B:
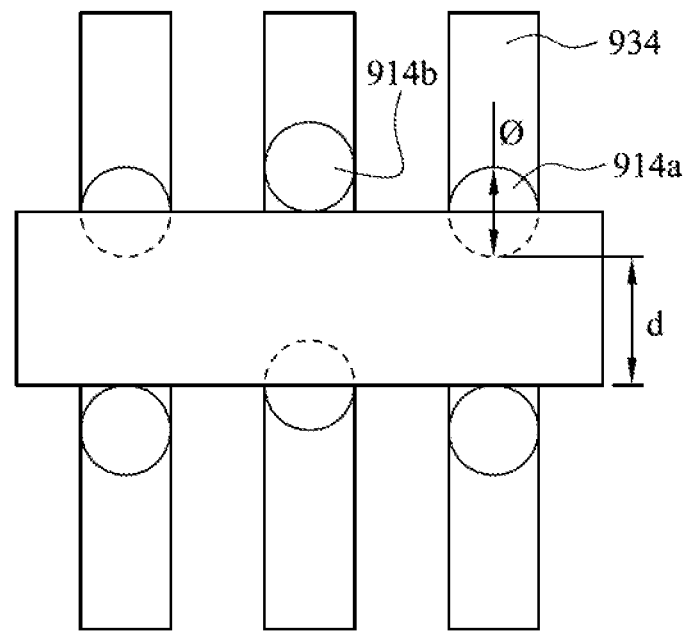
FIG. 20B illustrates formation of offset vias in accordance with embodiments of the present disclosure.

FIG. 20A is a comparative example illustrating formation of offset vias, and FIG. 20B illustrates formation of offset vias in accordance with embodiments of the present disclosure.

In the comparative example illustrated in FIG. 20A, a cut-metal pattern having a curved opening 820 is utilized to form vias 814 having an offset with an offset distance (t). The offset distance (t) may be measured as a distance between a center of a via 814a and an edge of an offset via 814b. In some embodiments, the distance (t) may be equal to or less than 30 nm. However, it is difficult to pattern cut-metal with offset vias using traditional techniques, at least in part because the cut-metal pattern should have a curved opening 820 which is difficult to form and to work with.

However, as shown in FIG. 20B, in embodiments of the present disclosure in which the vias 914 are self-aligned with the line ends of the conductive layer 934, the cut-metal pattern may have a substantially rectangular opening 920. This facilitates formation of offset vias 914a, 914b, while avoiding the difficulties associated with a curved cut-metal opening.

The present disclosure provides, in various embodiments, methods and devices in which conductive vias are self-aligned with respect to line ends of a conductive line, thereby facilitating a reduction in the distance or gap that may be achieved between patterned features of an integrated circuit. In some embodiments, a via may be formed prior to a cut-metal process in which a portion of the conductive line is selectively removed, thereby forming the line end of a conductive line that is aligned with the via. The cut process may be performed with a single cut-metal pattern or mask. The reduced mask usage, as compared to conventional techniques, reduces production costs and time. Moreover, the methods and devices provided herein can relieve the via to metal line end enclosure budget and the via to cut-metal spacing budget.

According to one embodiment, a method includes forming a first via on a conductive layer. A mask is formed over the conductive layer, and the mask has an opening overlying a portion of the conductive layer and at least partially overlying the first via. A first line end of the conductive layer is formed by selectively removing the portion of the conductive layer, the first via being aligned with the first line end of the conductive layer.

According to another embodiment, a method is provided that includes forming a conductive via on a conductive layer. The conductive layer is disposed on a source or drain region of a gate-all-around transistor. A mask is formed over the conductive layer, and the mask has an opening overlying a portion of the conductive layer and at least partially overlying the conductive via. The conductive layer is separated into a first segment and a second segment by selectively removing the portion of the conductive layer, and the conductive via is aligned with and has a same shape as an end of the first segment of the conductive layer.

According to yet another embodiment, a device includes a first segment of a conductive layer, and the first segment terminates at a curved line end. A second segment of the conductive layer is aligned with and spaced apart from the first segment by a gap. A conductive via is disposed on the first segment of the conductive layer, with an outer periphery of the conductive via being aligned with and having a same shape as the curved line end of the first segment of the conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a first via on a conductive layer;
   forming a mask over the conductive layer, the mask having an opening overlying a portion of the conductive layer and at least partially overlying the first via; and
   forming a first line end of the conductive layer by selectively removing the portion of the conductive layer by using the mask and the first via as an etching mask, the first via being aligned with the first line end of the conductive layer.

2. The method of claim 1, wherein forming the mask over the conductive layer comprises forming a hard mask on the conductive layer.

3. The method of claim 1, wherein the selectively removing the portion of the conductive layer comprises etching the conductive layer with an etchant.

4. The method of claim 3, wherein the conductive layer is formed of one or more of Co, Ru, or W, and the forming the first via on the conductive layer comprises forming the first via of a different material than the conductive layer and having an etchant selectivity that is lower than an etchant selectivity of the conductive layer.

5. The method of claim 1, wherein the first via is a dummy via, the method further comprising:

forming a cavity by removing the dummy via subsequent to the forming the first line end of the conductive layer; and
   forming a conductive via in the cavity, the conductive via being aligned with the first line end of the conductive layer.

6. The method of claim 5, wherein the dummy via comprises an electrically insulating material.

7. The method of claim 5, further comprising:
   forming a dielectric layer;
   forming an opening in the dielectric layer overlying the conductive layer; and
   forming the dummy via in the opening.

8. The method of claim 5, wherein the forming the conductive via in the cavity comprises forming the conductive via of a same material as the conductive layer.

9. The method of claim 1, further comprising:
   forming a second via on the conductive layer;
   forming the mask opening at least partially overlying the second via, the second via aligned with the first via at opposite ends of the opening;
   wherein the selectively removing the portion of the conductive layer comprises forming a second line end of the conductive layer, the second via being aligned with the second line end of the conductive layer.

10. The method of claim 9, wherein the forming the second via comprises forming the second via with a center of the second via spaced apart from a center of the first via by a distance less than or equal to 30 nm.

11. A method, comprising:
    forming a conductive via on a conductive layer, the conductive layer disposed on a source or drain region of a gate-all-around transistor;
    forming a mask over the conductive layer, the mask having an opening overlying a portion of the conductive layer; and
    separating the conductive layer into a first segment and a second segment by selectively removing the portion of the conductive layer, the conductive via being aligned with and having a same shape as an end of the first segment of the conductive layer.

12. The method of claim 11, further comprising:
    forming a dielectric layer on the gate-all-around transistor, the mask opening overlying a portion of the dielectric layer; and
    selectively removing the portion of the dielectric layer.

13. The method of claim 12, further comprising:
    forming a dummy via on the conductive layer, the dummy via extending through the dielectric layer and contacting the conductive layer;
    forming an opening through the dielectric layer by removing the dummy via subsequent to the separating the conductive layer into the first segment and the second segment, the opening being aligned with and having the same shape as the end of the first segment of the conductive layer; and
    forming the conductive via in the opening.

14. The method of claim 13, wherein the forming the dummy via comprises forming the dummy via of an electrically insulating material.

15. The method of claim 13, wherein the forming the dummy via on the conductive layer comprises forming the dummy via of a material having an etchant selectivity that is lower than an etchant selectivity of the conductive layer.

16. The method of claim 15, wherein the forming the conductive via in the opening comprises forming the conductive via of a same material as the conductive layer.

17. A method, comprising:
   forming a conductive layer;
   forming a conductive via contacting the conductive layer; and
   forming, from the conductive layer, a first segment of the conductive layer and a second segment of the conductive layer by forming a gap between the first segment of the conductive layer and the second segment of the conductive layer using the conductive via as at least a portion of an etching mask, the first segment terminating at a curved line end,
   the second segment aligned with the first segment,
   an outer periphery of the conductive via being aligned with and having a same shape as the curved line end of the first segment of the conductive layer.

18. The method of claim 17, further comprising forming a gate-all-around transistor having a source or drain region, wherein the first segment of the conductive layer contacts and is electrically connected to the source or drain region.

19. The method of claim 18, further comprising forming a first dielectric layer on the gate-all-around transistor, wherein the conductive via extends through the first dielectric layer.

20. The method of claim 19, further comprising forming a second dielectric layer on the gate-all-around transistor, the second dielectric layer overlying the gap between the first and second segments of the conductive layer and contacting the first dielectric layer.

\* \* \* \* \*